United States Patent
Miyata et al.

(10) Patent No.: US 11,594,417 B2
(45) Date of Patent: Feb. 28, 2023

(54) ETCHING METHOD AND APPARATUS

(71) Applicants: TOKYO ELECTRON LIMITED, Tokyo (JP); CENTRAL GLASS COMPANY, LIMITED, Ube (JP)

(72) Inventors: Kazuhito Miyata, Nirasaki (JP); Nobuhiro Takahashi, Nirasaki (JP); Takehiko Orii, Nirasaki (JP); Shunta Furutani, Yamaguchi (JP); Shoi Suzuki, Yamaguchi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/900,227

(22) Filed: Jun. 12, 2020

(65) Prior Publication Data
US 2020/0395219 A1 Dec. 17, 2020

(30) Foreign Application Priority Data

Jun. 14, 2019 (JP) .............................. JP2019-111110

(51) Int. Cl.
*H01L 21/67* (2006.01)
*H01L 21/3065* (2006.01)
*H01L 21/02* (2006.01)

(52) U.S. Cl.
CPC .... *H01L 21/3065* (2013.01); *H01L 21/02057* (2013.01); *H01L 21/67069* (2013.01)

(58) Field of Classification Search
CPC ........... H01L 21/02057; H01L 21/3065; H01L 21/31116; H01L 21/31138; H01L 21/67069; H01L 21/0273; H01L 21/0337; H01L 21/30604; H01L 21/30608; H01L 21/32134; H01L 21/32136; H01L 21/32137; H01L 21/67075; H01L 21/02532; H01L 21/0262; H01L 21/32135
USPC ........ 438/700, 706, 714, 719, 736, 738, 752
See application file for complete search history.

(56) References Cited

U.S. PATENT DOCUMENTS

| | | | |
|---|---|---|---|
| 9,093,468 B2 * | 7/2015 | Tsai | H01L 29/66628 |
| 9,117,658 B2 * | 8/2015 | Takenaka | H01L 29/51 |
| 10,734,517 B2 * | 8/2020 | Huang | H01L 29/0692 |
| 2007/0287272 A1 * | 12/2007 | Bauer | H01L 29/66636 438/485 |
| 2012/0244674 A1 * | 9/2012 | Kim | H01L 21/02057 438/299 |
| 2013/0025538 A1 * | 1/2013 | Collins | H01L 21/68735 118/712 |
| 2014/0264558 A1 * | 9/2014 | Chandra | H01L 29/045 257/329 |
| 2014/0357082 A1 * | 12/2014 | Bedell | H01L 21/3065 438/694 |
| 2016/0322474 A1 * | 11/2016 | Tsai | H01L 29/165 |

(Continued)

FOREIGN PATENT DOCUMENTS

| | | |
|---|---|---|
| JP | 2009-510750 A | 3/2009 |
| JP | 2016-143781 A | 8/2016 |

*Primary Examiner* — Binh X Tran
(74) *Attorney, Agent, or Firm* — Fenwick & West LLP

(57) ABSTRACT

A technique of etching Si on a substrate having Si and another material with a high selectivity using a simple gas system is provided. In an etching method, the substrate having the Si and another material is provided, and the Si is selectively etched over the above-described another material by supplying a germanium-containing gas as an etching gas to the substrate.

13 Claims, 9 Drawing Sheets

(56) References Cited

U.S. PATENT DOCUMENTS

2017/0133206 A1* 5/2017 Tahara .............. H01J 37/32715
2019/0214314 A1* 7/2019 Seo ................... H01L 29/66553

* cited by examiner

ETCHING METHOD AND APPARATUS

CROSS-REFERENCE TO RELATED APPLICATION

This application claims priority to Japanese Patent Application No. 2019-111110, filed on Jun. 14, 2019, the entire contents of which are incorporated herein by reference.

TECHNICAL FIELD

The present disclosure relates to an etching method and apparatus.

BACKGROUND

Recently, in a semiconductor device manufacturing process, a technique for etching silicon (Si) with a high selectivity with respect to another film is required. For example, Japanese Patent Application Publication No. 2016-143781 discloses that Si can be selectively etched with respect to silicon germanium (SiGe) by supplying $F_2$ gas and $NH_3$ gas to a substrate having Si and SiGe.

The present disclosure provides a technique capable of using a simple gas system to perform highly selective etching of Si over a substrate having Si and another material.

SUMMARY

In accordance with an aspect of the present disclosure, there is provided an etching method including: providing a substrate having Si and another material; and selectively etching the Si over the other material by supplying a germanium-containing gas as an etching gas to the substrate.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

BACKGROUND AND OUTLINE

First, the background and the outline of an etching method according to an embodiment of the present disclosure will be described.

Recently, in a semiconductor device manufacturing process, it is required to selectively etch Si on a substrate having Si and another material. For example, Japanese Patent Application Publication No. 2016-143781 discloses that Si can be selectively etched over SiGe by supplying $F_2$ gas and $NH_3$ gas to a substrate having Si and silicon germanium (SiGe).

Since, however, the Publication No. 2016-143781 mainly focuses on performing both the selective etching of Si over SiGe and the selective etching of SiGe over Si by varying ratios of the $F_2$ gas and the $NH_3$ gas, it is difficult to sufficiently increase the selectivity in etching of Si by the method disclosed in the Publication No. 2016-143781. Further, in order to selectively etch one of Si and SiGe over the other in the same gas system, it is necessary to precisely adjust the gas ratio.

Therefore, the present inventors have studied a technique capable of highly selective etching of Si using a simple gas system. As a result, they have found that it is effective to use a gas containing germanium (Ge) as an etching gas.

In other words, the present inventors have found that $GeF_4$ gas is generated by the reaction in a test using a technique for selectively etching SiGe over Si using a $ClF_3$ gas, which is disclosed in Japanese Patent Application Publication No. 2009-510750, and Si is etched by the $GeF_4$ gas thus generated. They also have found that it is difficult to etch materials other than Si such as GeSi or the like by using the $GeF_4$ gas. In view of the above, the present inventors have conceived a technique capable of performing highly selective etching of Si over SiGe or the like using, as an etching gas, a Ge-containing gas such as $GeF_4$ gas.

Embodiment of Etching Method

Figure 1:
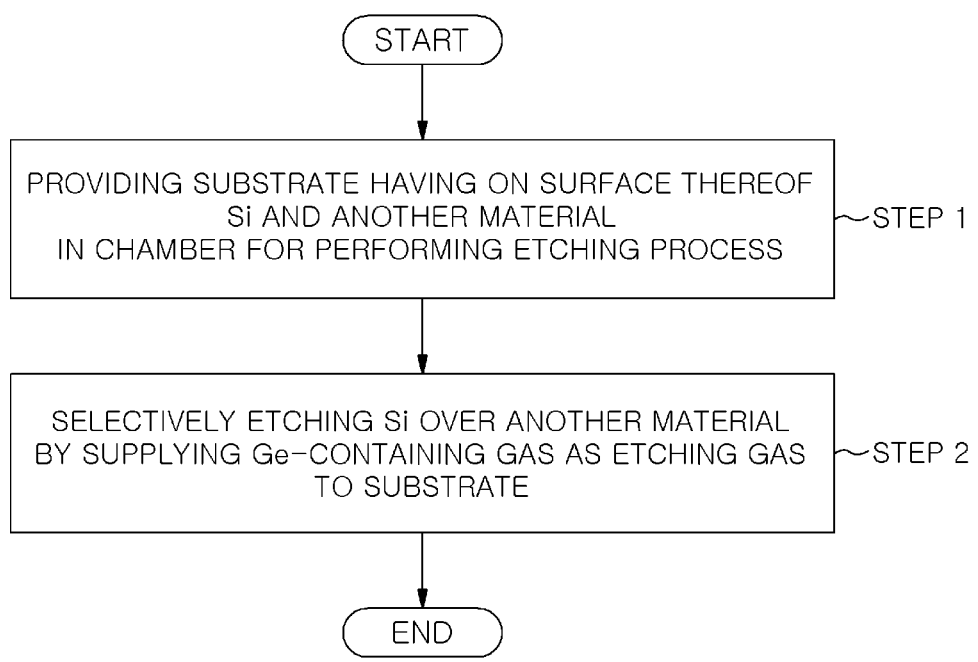
FIG. 1 is a flowchart showing an etching method according to an embodiment.

Next, a specific embodiment will be described. FIG. 1 is a flowchart showing an etching method according to an embodiment.

First, a substrate having on a surface thereof Si and another material is provided in a chamber for performing an etching process (step 1).

Another material is not particularly limited as long as it is generally used for a semiconductor device, and may be SiGe, Ge, $SiO_2$, SiN, or the like. Among those materials, SiGe and Ge have drawn attention as being materials that coexist with Si.

Although the ratio of Si and Ge in SiGe is not particularly limited, it is preferable that SiGe contains 20 at % or more of Ge. Further, SiGe, Ge, and Si can be used in various forms such as films and the like, and the films thereof may be formed by an epitaxial method. Moreover, although the substrate is not particularly limited, a semiconductor wafer (hereinafter, simply referred to as "wafer") is used as an example of the substrate.

As long as Si and SiGe or Si and Ge coexist, the structure thereof is not particularly limited. For example, a structure in which a Si film and a SiGe film or a Si film and a Ge film are alternately laminated may be used.

Figure 2:
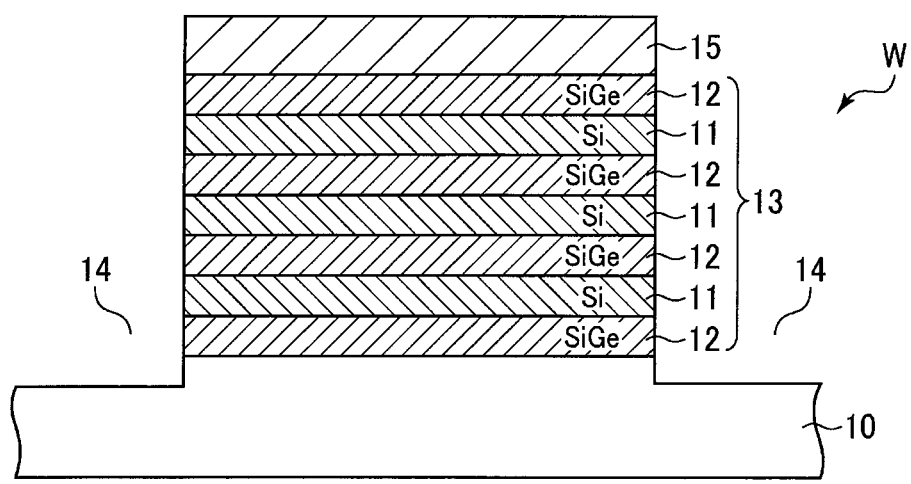
FIG. 2 is a cross-sectional view showing an example of a structure of a wafer to which the etching method according to the embodiment is applied.

A wafer W having a structure shown in FIG. 2 is used as an example of a substrate having such a laminated structure in which an Si film and an SiGe film (or an Si film and a Ge film) are alternately laminated. The wafer W shown in FIG. 2 has a laminated structure 13 in which an Si film 11 and an SiGe film 12 are alternately laminated on a surface of a base 10 in which a specific protective film (e.g., SiO$_2$, SiN) is formed on Si. A Ge film may be used instead of the SiGe film 12. The uppermost layer of the laminated structure 13 is the SiGe film 12, and a mask layer 15 made of, e.g., SiO$_2$ or SiN, is formed thereon. Recesses 14 are formed in the laminated structure 13 by plasma etching. The side surface of the Si film 11 and the side surface of the SiGe film 12 that are alternately laminated are exposed to the recesses 14.

Next, a Ge-containing gas is supplied as an etching gas to the substrate, so that the Si on the surface of the substrate is selectively etched over another material (step 2).

For the Ge-containing gas, a compound gas of Ge and hydrogen (H) or a compound gas of Ge and halogen may be used. For example, at least one of GeF$_4$ gas, GeF$_2$Cl$_2$ gas, GeCl$_4$ gas, and GeH$_4$ gas may be used for the compound gas.

Accordingly, the highly selective etching of Si over another material can be performed. For example, when Si coexists with SiGe containing Ge at a content of 20 at % or more, GeF$_4$ gas can selectively etch Si with a selectivity of 50 or more with respect to SiGe. Further, an extremely high selectivity of 100 or more can be obtained with respect to Ge. Moreover, Si can also be etched with an extremely high selectivity of 100 or more with respect to SiO$_2$ and SiN.

Figure 3:
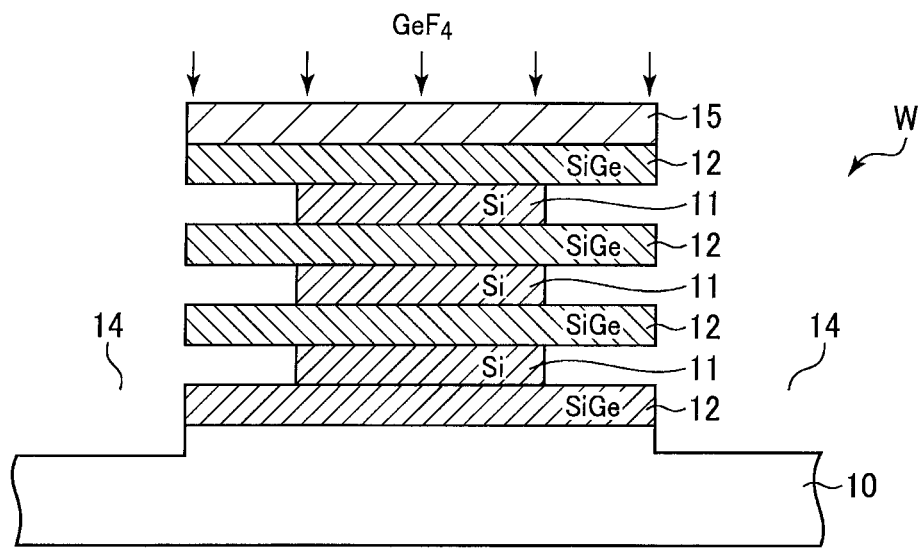
FIG. 3 is a cross-sectional view showing a state in which a Si film is partially etched in the wafer having the structure shown in FIG. 2.
Figure 4:
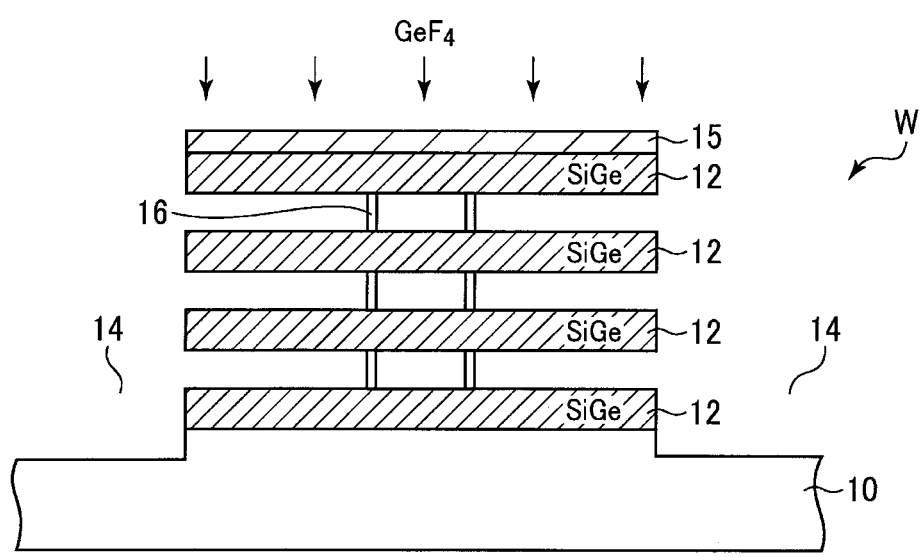
FIG. 4 is a cross-sectional view showing a state in which the Si film is entirely etched in the wafer having the structure shown in FIG. 2.

For example, by supplying a Ge-containing gas such as GeF$_4$ gas as an etching gas to the wafer W shown in FIG. 2, the Si film 11 is side-etched, so that the Si film 11 is selectively etched over the SiGe film 12 as shown in FIG. 3. In this case, the Si film 11 may be partially etched as shown in FIG. 3 or may be entirely etched as shown in FIG. 4. Even if the Si film 11 is entirely etched, the remaining SiGe film 12 is supported by supporting columns 16 made of SiN or the like.

In addition to the Ge-containing gas serving as the etching gas, a dilution gas for diluting the etching gas may be supplied. As the dilution gas, an inert gas such as N$_2$ gas or a noble gas such as Ar gas can be used. The flow rate ratio of the dilution gas may be appropriately set depending on the etching conditions and the required degree of etching. The flow rate of the GeF$_4$ gas may be, e.g., within a range of 10 sccm to 1000 sccm and the flow rate of the dilution gas may be, e.g., within a range of 50 sccm to 1000 sccm.

The pressure in the chamber in the etching of step 2 is preferred to be in a range of 1.33 Pa to 39990 Pa (0.01 Torr to 300 Torr). The reaction (1) to be described below easily proceeds at such a pressure range. The pressure is more preferred to be in a range of 6.67 Pa to 1333.2 Pa (0.05 Torr to 10 Torr).

The processing temperature (wafer temperature) in the etching of step 2 is preferably higher than or equal to −20° C. and lower than or equal to 300° C. Since the boiling point of GeF$_4$ is −36.5° C., gas etching can be performed even at a low temperature. As the temperature increases, the reaction (1) to be described below proceeds more easily and thus the etching rate increases. However, the selectivity tends to decrease. On the other hand, at a low temperature, the etching rate decreases whereas the selectivity tends to increase. Therefore, in order to perform highly selective etching of Si, the lower temperature is preferred. The temperature is preferably lower than or equal to 150° C., and more preferably lower than or equal to 50° C.

The etching at this time may be non-plasma gas chemical etching or may be plasma etching. The non-plasma etching is advantageous in that no damage from plasma occurs, higher etching selectivity can be obtained, and the apparatus can be simplified.

It is presumed that the etching of Si by the Ge-containing gas, with GeF$_4$ gas as an example, occurs based on the following formula (1):

$$Si + 2GeF_4 \rightarrow SiF_4\uparrow + 2GeF_2\uparrow \quad (1)$$

The reaction of the formula (1) hardly occurs for other materials and, thus, it is presumed that only Si is selectively etched. When one of other materials is SiGe, Si is contained therein. However, the Si contained in SiGe is protected by Ge and hardly etched by the GeF$_4$ gas. Similarly, SiO$_2$ and SiN are hardly etched because Si is firmly bonded to oxygen and nitrogen, respectively. Further, when another material is Ge, Si is not contained therein and Ge does not react with GeF$_4$, which makes it difficult to etch Ge.

Conventionally, in the case of selectively etching Si over another material, particularly in the case of selectively etching Si over SiGe or Ge, F$_2$ gas and NH$_3$ gas were used as the processing gas as disclosed in Japanese Patent Application Publication No. 2016-143781. However, the Publication No. 2016-143781 focuses on performing both the selective etching of Si over SiGe and the selective etching of SiGe over Si by changing the ratio of F$_2$ gas and NH$_3$ gas, and does not focus on performing highly selective etching of Si over SiGe. In other words, in the Publication No. 2016-143781, a volume ratio of NH$_3$ gas to the sum of F$_2$ gas and NH$_3$ gas (NH$_3$/(F$_2$+NH$_3$)) is set to fall within a range of 18 to 50 volume % (flow rate %) when Si is selectively etched over SiGe, and the ratio of NH$_3$/(F$_2$+NH$_3$) is set to fall within a range of 0 to 15 volume % (flow rate %) when SiGe is etched over Si. Accordingly, a selectivity of 2 or more is merely obtained. Although the selectivity can be further increased by adjusting the gas ratio, the selectivity may be increased up to at most 10. Further, when the gas ratio changes, the etching target is switched between Si and SiGe and, thus, it is necessary to precisely adjust the gas ratio.

On the other hand, in the present embodiment, by optimizing the processing conditions, Si can be etched with a selectivity of 50 or more, and even 100 or more, over another material using the simple gas system that uses only Ge-containing gas such as GeF$_4$ gas or the like as the etching gas. Particularly, the present embodiment is effective for a substrate having a structure that has drawn attention lately in which Si and SiGe or Si and Ge coexist, the substrate having a structure in which a Si film and a SiGe film or a Si film and a Ge film are alternately laminated, for example.

Figure 5:
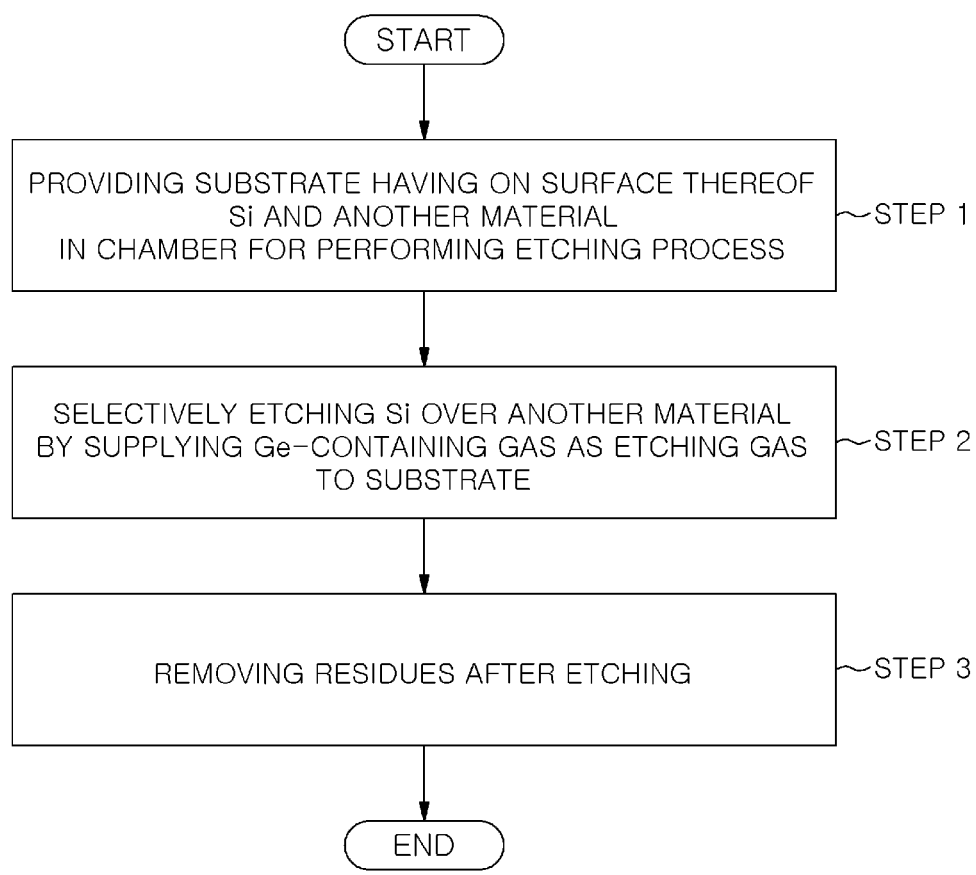
FIG. 5 is a flowchart showing an etching method according to another embodiment.

In the above embodiment, the etching was performed in steps 1 and 2. However, as shown in FIG. 5, a step of removing residues (step 3) may be performed, if necessary, after the etching of step 2. The method of removing the residues is not particularly limited. For example, the residues may be removed by heat treatment. The residues include etching residues and reaction products generated by the etching. Particularly, GeF$_2$ generated by the reaction of the above formula (1) has a relatively high boiling point of 130° C. Thus, if the etching is performed at a temperature lower than 130° C., GeF$_2$ remains as the reaction products on the substrate. Accordingly, in this case, a process of sublimating GeF$_2$ in step 3 is required.

Figure 6:
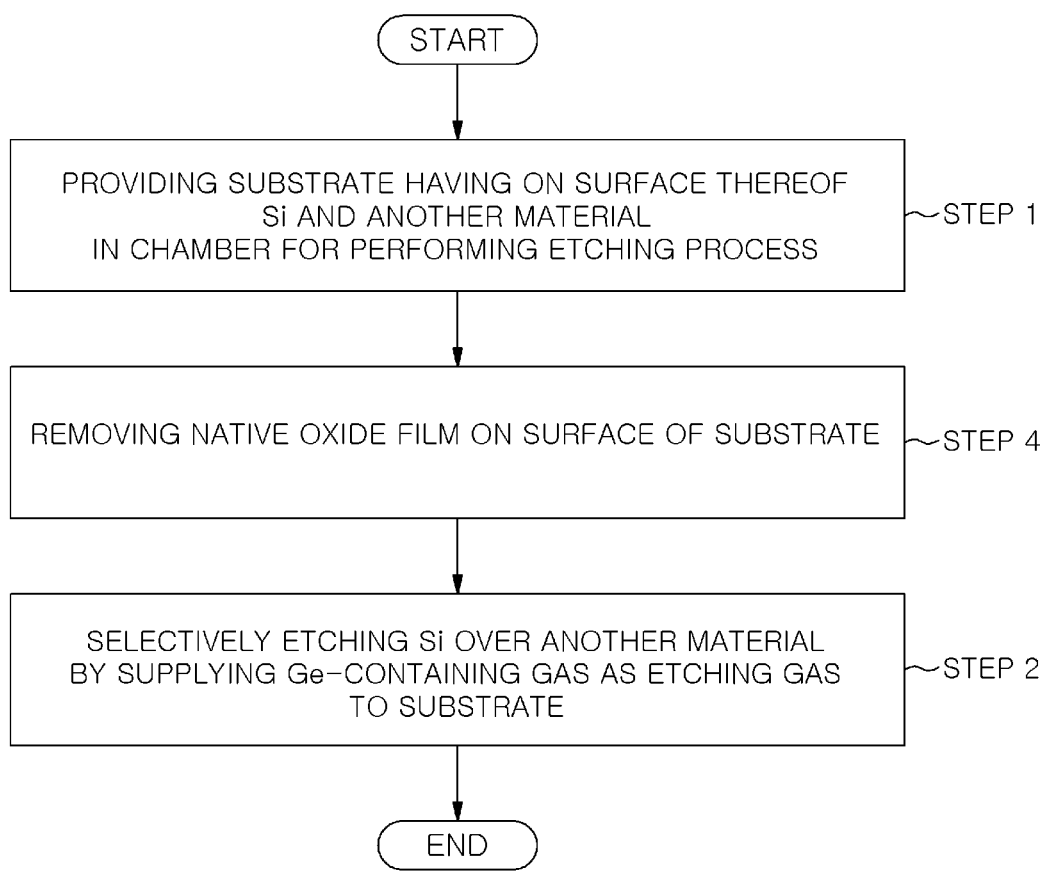
FIG. 6 is a flowchart showing an etching method according to still another embodiment.
Figure 7:
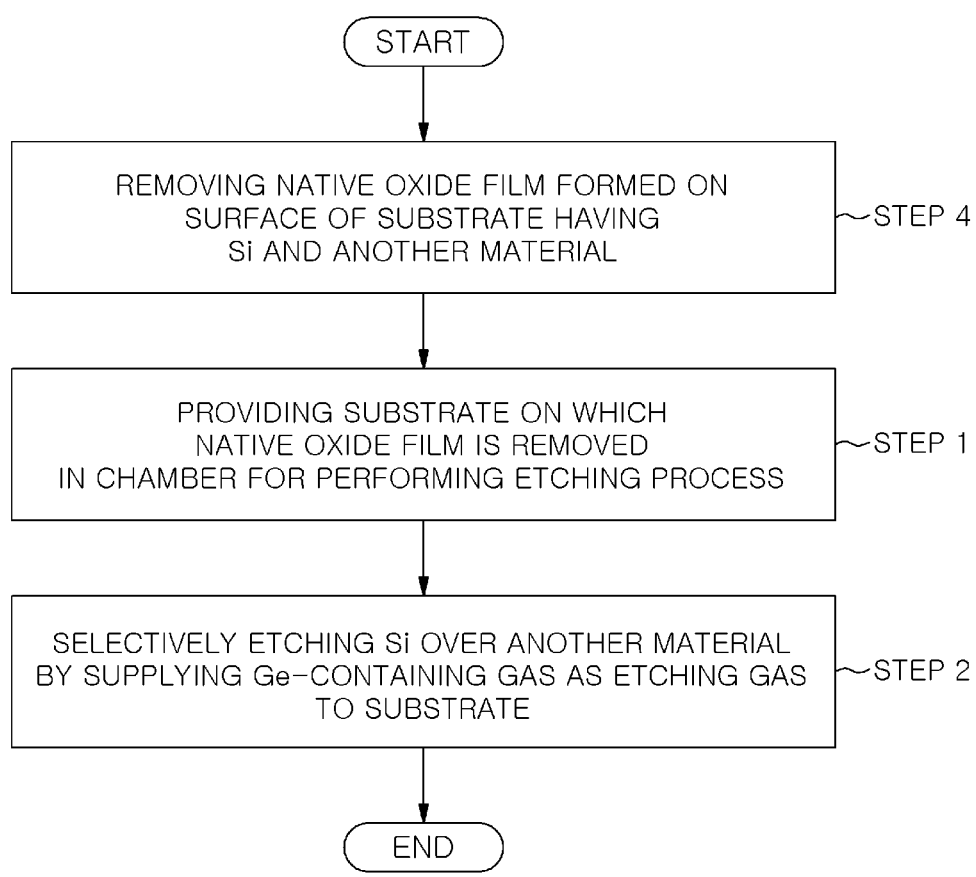
FIG. 7 is a flowchart showing an etching method according to further still another embodiment.

In addition, there may be a case where a thin natural oxide film is formed on the surface of the substrate (the laminated structure 13). In that case, it is preferable to perform a step of removing the natural oxide film prior to the etching. The natural oxide film is removed by supplying, e.g., HF gas and NH$_3$ gas. As shown in FIG. 6, the step of removing the native oxide film (step 4) may be performed in the chamber after the step 1 of providing the substrate in the chamber or may be performed in another chamber before the substrate is provided in the chamber as shown in FIG. 7. Alternatively, the removal of the natural oxide film and the removal of the residues after the etching may be performed together.

The etching in step 2 may be a cycle etching in which the supplying of the processing gas including GeF$_4$ gas and the purging of the chamber (evacuation or evacuation+supply of purge gas) are repeated. Further, when it is necessary to remove the reaction products and the like, the supply of the processing gas including GeF$_4$ gas and the removal of the residues (heating) in step 3 may be repeatedly performed. Accordingly, the remaining amount of the etching residues and the reaction products can be further reduced.

An Example Processing System

Figure 8:
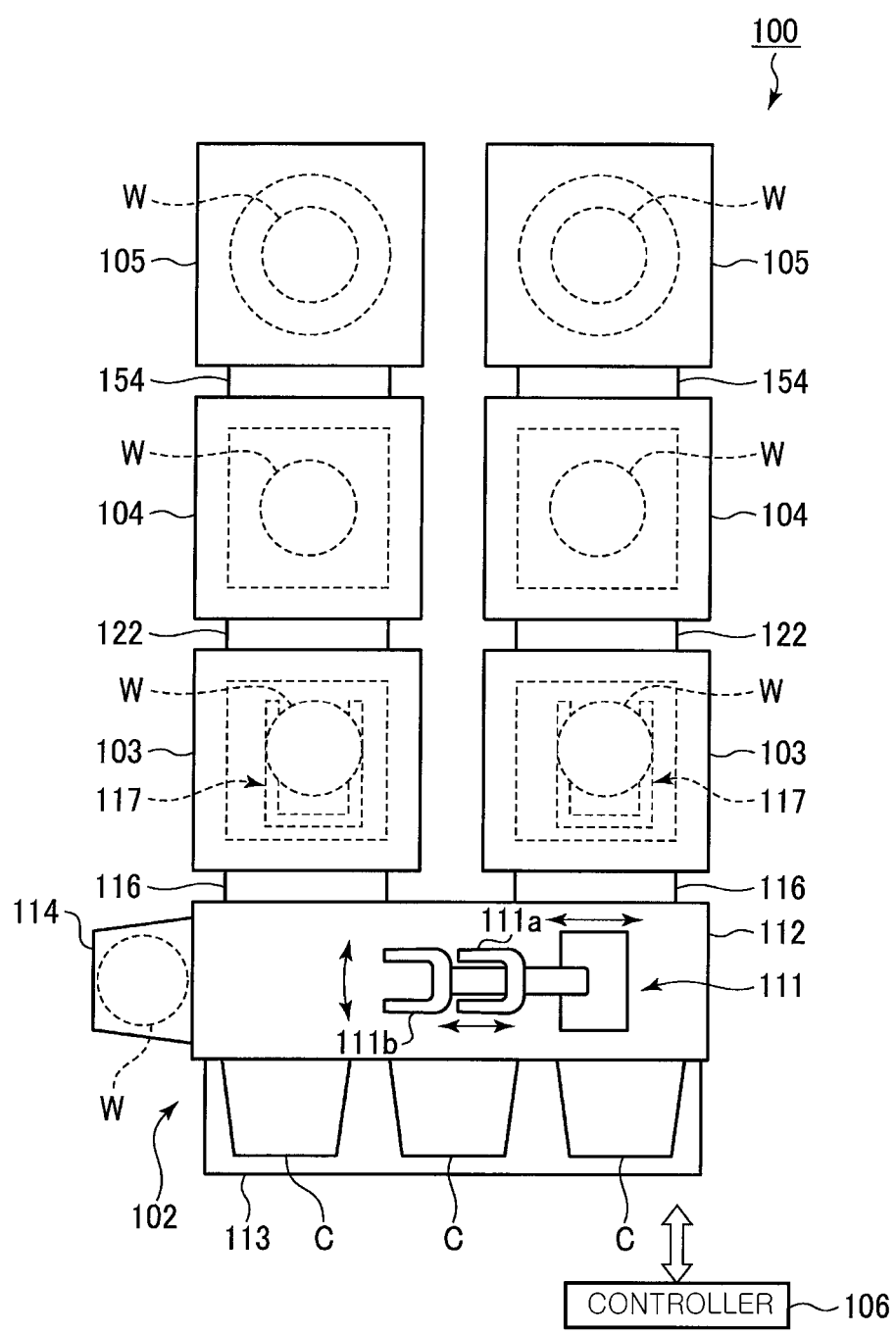
FIG. 8 is a schematic configuration view showing an example of a processing system used for the etching method according to the embodiment.

Next, an example of a processing system used for the etching method according to the embodiment will be described. FIG. 8 is a schematic configuration view showing an example of a processing system.

As shown in FIG. 8, a processing system 100 includes a loading/unloading unit 102 configured to load and unload the wafer W having the structure shown in FIG. 2, two load-lock chambers 103 disposed adjacent to the loading/unloading unit 102, two heat treatment apparatuses 104 disposed adjacent to the corresponding load-lock chambers 103 and configured to perform heat treatment on the wafer W, two etching apparatuses 105 disposed adjacent to the corresponding heat treatment apparatuses 104 and configured to perform etching on the wafer W, and a controller 106.

The loading/unloading unit 102 includes a transfer chamber 112 in which a first wafer transfer mechanism 111 for transferring the wafer W is disposed. The first wafer transfer mechanism 111 has two transfer arms 111a and 111b configured to hold the wafer W in a substantially horizontal posture. A substrate support 113 is disposed at one longitudinal side of the transfer chamber 112. The substrate support 113 is configured to connect, e.g., three carriers C such as FOUPs, each accommodating a plurality of wafers W. An alignment chamber 114 configured to perform a position-alignment of the wafer W is disposed adjacent to the transfer chamber 112.

In the loading/unloading unit 102, the wafer W is held by one of the transfer arms 111a and 111b and is moved linearly within a substantially horizontal plane or moved vertically by the operation of the first wafer transfer mechanism 111. Thereby, the wafer W can be transferred to a desired position. Further, the wafer W is loaded into and unloaded from the carriers C supported on the substrate support 113, the alignment chamber 114, and the load-lock chambers 103 as the transfer arms 111a and 111b move toward or away from the carriers C, the alignment chamber 114, and the load-lock chambers 103.

Each of the load-lock chambers 103 is connected to the transfer chamber 112 with gate valves 116 interposed between each of the load-lock chambers 103 and the transfer chamber 112. A second wafer transfer mechanism 117 for transferring a wafer W is disposed in each of the load-lock chambers 103. Each of the load-lock chambers 103 can be evacuated to a predetermined vacuum level.

The second wafer transfer mechanism 117 has an articulated arm structure and includes a pick configured to hold the wafer W in a substantially horizontal posture. In the second wafer transfer mechanism 117, the pick is positioned within each of the load-lock chambers 103 when the articulated arm is retracted. The pick reaches the corresponding heat treatment apparatus 104 as the articulated arm is extended and can reach the corresponding etching apparatus 105 as the articulated arm is further extended. Accordingly, the wafer W can be transferred between the load-lock chambers 103, the heat treatment apparatuses 104, and the etching apparatuses 105.

The controller 106 is generally a computer and includes a main control unit having a CPU for controlling the respective components of the processing system 100, an input device (keyboard, mouse, or the like), an output device (printer or the like), a display device (display or the like) and a storage device (storage medium). The main control unit of the controller 106 causes the processing system 100 to execute a predetermined operation based on, e.g., processing recipes stored in a storage medium built in the storage device or in a storage medium installed in the storage device.

In the processing system 100, a plurality of wafers W, each having the above-described structure, is stored in the carrier C and transferred to the processing system 100. In the processing system 100, in a state where the atmosphere-side gate valve 116 is opened, one of the transfer arms 111a and 111b of the first wafer transfer mechanism 111 transfers one wafer W from the carrier C supported in the loading/unloading unit 102 to one of the load-lock chambers 103 and the wafer W is delivered to the pick of the second wafer transfer mechanism 117 in the corresponding load-lock chamber 103.

Then, the atmosphere-side gate valve 116 is closed to evacuate the inside of the load-lock chamber 103. Next, the gate valve 154 is opened and the pick is extended into the corresponding etching apparatus 105 to transfer the wafer W to the etching apparatus 105.

Thereafter, the pick is returned to the load-lock chamber 103 and the gate valve 154 is closed. Then, the etching of the Si film is performed in the etching apparatus 105 by using the above-described etching method.

After the etching is completed, the gate valves 122 and 154 are opened. If necessary, the etched wafer W is transferred to the corresponding heat treatment apparatus 104 by the pick of the second wafer transfer mechanism 117 so that the residues such as etching residue or reaction products can be removed by heating.

After the etching is completed or after the etching and the heat treatment in the heat treatment apparatus 104 are completed, the wafer W is returned to the carrier C by one of the transfer arms 111a and 111b of the first wafer transfer mechanism 111. In this manner, the processing of one wafer is completed.

When it is not necessary to remove the etching residues or the like, the heat treatment apparatus 104 may not be provided. In this case, the etched wafer W is transferred to the corresponding load-lock chamber 103 by the pick of the second wafer transfer mechanism 117 and then returned to the carrier C by one of the transfer arms 111a and 111b of the first wafer transfer mechanism 111.

Etching Apparatus

Next, an example of the etching apparatus 105 for performing the etching method according to the embodiment will be described in detail.

Figure 9:
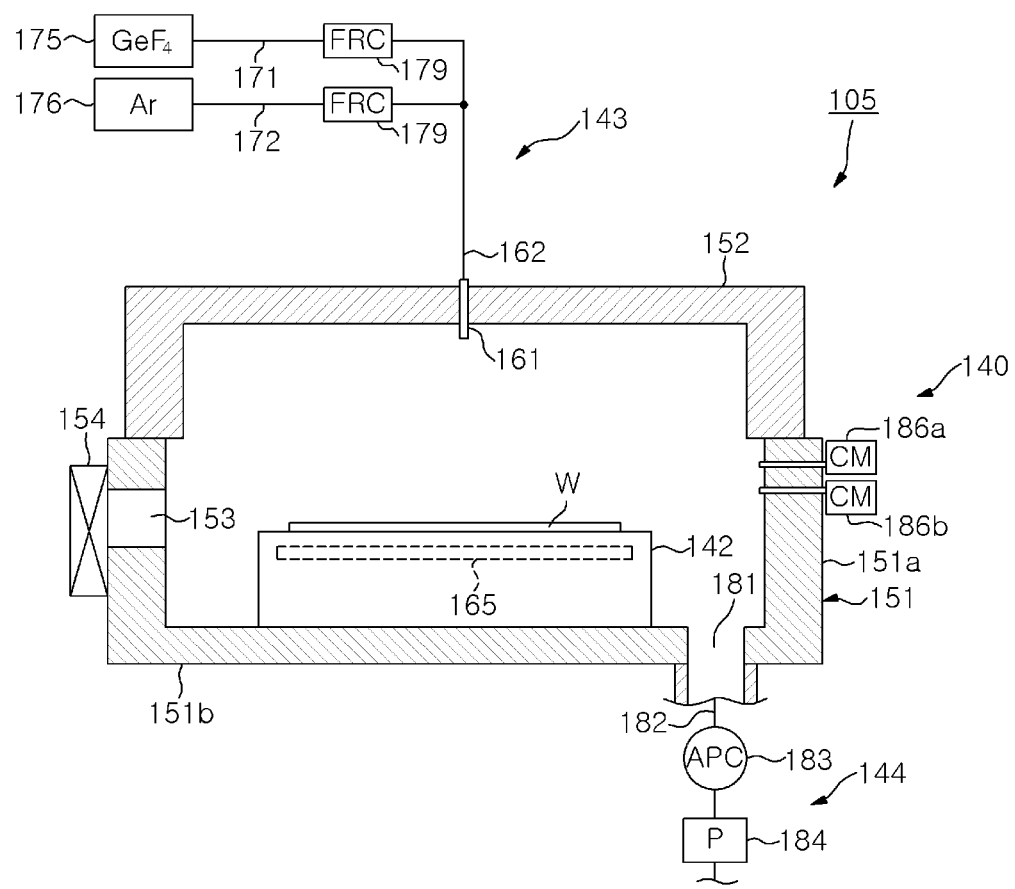
FIG. 9 is a cross-sectional view showing an etching apparatus for performing the etching method according to the embodiment.

FIG. 9 is a cross-sectional view showing an example of the etching apparatus 105. As shown in FIG. 9, the etching apparatus 105 includes an airtight chamber 140 as a processing container that defines a processing space. A substrate support 142 for substantially horizontally supporting thereon the wafer W is disposed in the chamber 140. The etching apparatus 105 further includes a gas supply unit 143 configured to supply an etching gas to the chamber 140 and a gas exhaust unit 144 configured to exhaust the inside of the chamber 140.

The chamber 140 includes a chamber body 151 and a lid 152. The chamber body 151 has a substantially cylindrical sidewall 151a and a bottom portion 151b. The chamber body 151 has an opening at an upper portion thereof and the opening is closed by the lid 152. The sidewall 151a and the lid 152 are sealed by a sealing member (not shown), so that the airtightness in the chamber 140 is ensured. A gas inlet nozzle 161 is extended from above and inserted into the chamber 140 through a ceiling wall of the lid 15.

A loading/unloading port 153 through which the wafer W is loaded and unloaded into and from the heat treatment apparatus 104 is disposed at the sidewall 151a. The loading/unloading port 153 can be opened and closed by a gate valve 154.

The substrate support 142 has a substantially circular shape in a plan view and is fixed to the bottom portion 151b of the chamber 140. A temperature controller 165 configured to adjust the temperature of the substrate support 142 is disposed in the substrate support 142. The temperature controller 165 has, e.g., a conduit through which a temperature control medium (e.g., water) circulates. The temperature of the substrate support 142 is controlled by heat exchange between the substrate support 142 and the temperature control medium flowing in the conduit. Accordingly, the temperature of the substrate support 142 is controlled and, thus, the temperature of the wafer W on the substrate support 142 is controlled.

The gas supply unit 143 includes a $GeF_4$ gas supply source 175 for supplying $GeF_4$ gas that is a Ge-containing gas serving as an etching gas, and an Ar gas supply source 176 for supplying Ar gas that is an inert gas. One ends of lines 171 and 172 are connected to the $GeF_4$ gas supply source 175 and the Ar gas supply source 176, respectively. The other ends of the lines 171 and 172 are connected to a common line 162. The common line 162 is connected to the above-described gas inlet nozzle 161.

Therefore, the $GeF_4$ gas that is the etching gas supplied from the $GeF_4$ gas supply source 175 and the Ar gas that is the inert gas supplied from the Ar gas supply source 176 reach the common line 162 through the line 171 and 172 and are injected toward the wafer W in the chamber 140 from the gas inlet nozzle 161. The $GeF_4$ gas is supplied as an etching gas, and the Ar gas is supplied as a dilution gas and a purge gas. The Ge-containing gas used as the etching gas is not limited to the $GeF_4$ gas and may be another gas, e.g., $GeF_2Cl_2$ gas, $GeCl_4$ gas, or $GeH_4$ gas. Further, the inert gas used as the dilution gas or the purge gas may be another noble gas or $N_2$ gas.

Each of the lines 171 and 172 are provided with a flow rate controller (FRC) 179 for opening/closing the flow path and controlling the flow rate. The flow rate controller 179 may include an on/off valve and a mass flow controller.

In the etching apparatus 105 of the present example, a shower plate may be disposed at the upper portion of the chamber 140 to supply a gas in a shower-like manner.

In case of removing the natural oxide film of the wafer W in the chamber 140, the gas supply unit 143 may be configured to further supply HF gas and $NH_3$ gas.

The gas exhaust unit 144 includes a gas exhaust line 182 connected to a gas exhaust port 181 formed at the bottom portion 151b of the chamber 140. The gas exhaust unit 144 further includes an automatic pressure control valve (APC) 183 disposed in the gas exhaust line 182 for controlling the internal pressure of the chamber 140 and a vacuum pump 184 for exhausting the inside of the chamber 140.

At the sidewall of the chamber 140, two capacitance manometers (CM) 186a and 186b serving as pressure gauges for measuring the internal pressure of the chamber 140 are provided such that the capacitance manometers 186a and 186b are inserted into the chamber 140. The capacitance manometer 186a is used to measure a high pressure while the capacitance manometer 186b is used to measure a low pressure. A temperature sensor (not shown) for detecting the temperature of the wafer W is disposed near the wafer W supported on the substrate support 142.

The respective components of the etching apparatus 105 are controlled by the controller 106 of the processing system 100. The main control unit of the controller 106 controls the respective components of the etching apparatus 105 such that an etching method to be described below can be performed based on processing recipes stored in a storage medium built in the storage device or in a storage medium installed in the storage device.

In the etching apparatus 105, the wafer W having, e.g., the structure shown in FIG. 2 is loaded into the chamber 140 and supported on the substrate support 142. The pressure in the chamber 140 is preferably within a range of 1.33 Pa to 39990 Pa (0.01 Torr to 300 Torr), and more preferably within a range of 6.67 Pa to 1333.2 Pa (0.05 Torr to 10 Torr). Further, the temperature of the wafer W is set to be higher than or equal to $-20°$ C. and lower than or equal to $300°$ C., preferably lower than or equal to $150°$ C., and more preferably lower than or equal to $50°$ C. by the temperature controller 165 disposed in the substrate support 142.

Next, $GeF_4$ gas serving as an etching gas is supplied into the chamber 140 at a flow rate of, e.g., 10 sccm to 1000 sccm, to selectively etch Si over another material. In the example of FIG. 2, the Si film is selectively etched over the SiGe film. At this time, if necessary, the etching property may be adjusted by supplying Ar gas as a dilution gas at a flow rate of, e.g., 50 sccm to 1000 sccm.

As described above, by using a Ge-containing gas such as $GeF_4$ gas as an etching gas, the highly selective etching of Si over another material such as SiGe, Ge, or the like can be performed.

In the case of removing the natural oxide film by the etching apparatus 105, the wafer W is loaded into the chamber 140 and supported on the substrate support 142. Then, prior to the etching, HF gas and $NH_3$ gas are supplied into the chamber 140 and, then, the wafer W is heated. Accordingly, the HF gas and the $NH_3$ gas react with the natural oxide film to produce ammonium fluorosilicate. The ammonium fluorosilicate is sublimated by subsequent heating. If the processing temperature is high, ammonium fluorosilicate can be volatilized during the heating process.

Test Example

Next, a test example will be described.

Here, samples in which a Si film, a SiGe film (30 at % of Ge), a thermal oxide film ($ThO_x$ film) ($SiO_2$ film), a SiN film, and a Ge film were respectively formed on bare wafers were prepared, and etching was performed using $GeF_4$ gas. The converted etching rate was determined from the conversion of the change in weight after the etching. The etching was performed under the following conditions by which the etching proceeds easily.

Etching Conditions

Gas: 100%-$GeF_4$
Gas flow rate: 10 sccm to 50 sccm
Pressure: 50 Torr to 150 Torr
Processing temperature (wafer temperature): 25° C. to 300° C.

Figure 10:
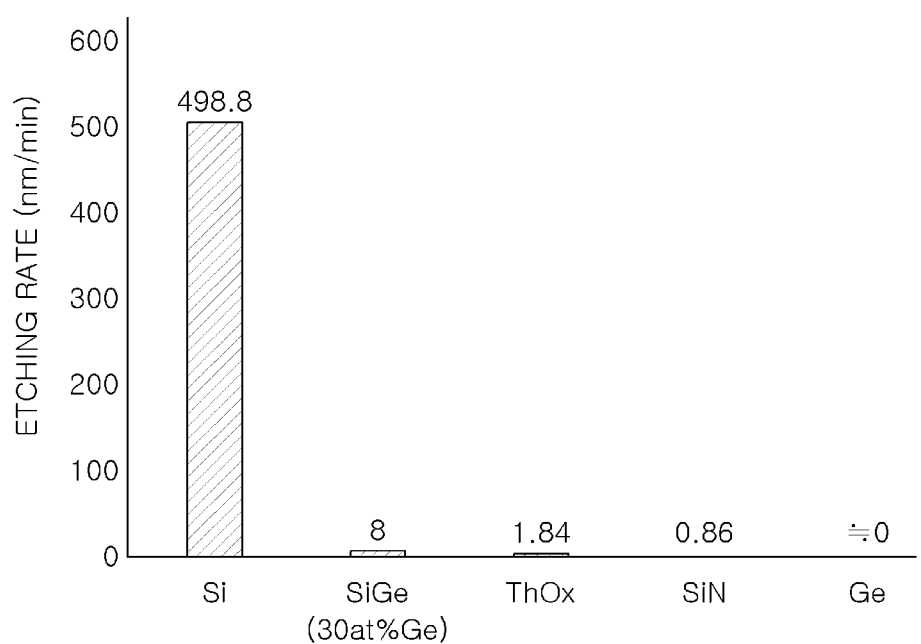
FIG. 10 shows a result of a test example.

First, the result obtained when the processing temperature (wafer temperature) was 150° C. is shown in FIG. 10. As shown in FIG. 10, the converted etching rate of the Si film was 498.8 nm/min while that of the SiGe film (30 at % of Ge) was 8 nm/min. Thus, it was found that, even under harsh etching conditions, the selectivity with respect to the SiGe film was a high value of 62. Further, the converted etching rates of the $ThO_x$ film ($SiO_2$ film) and the SiN film were 1.84 and 0.86, respectively. Thus, it was found that the Si film can be etched with a high selectivity of 100 or more over the $SiO_2$ film and the SiN film. Further, the converted etching rate of the Ge film was substantially 0. Thus, it was found that the Si film can be etched with a substantially infinite selectivity over the Ge film.

Further, when the etching was performed at the lower temperatures of 25° C. and 50° C., the converted etching rate of the Si film was 0.6 nm/min and 10 nm/min, respectively, which are lower than the rates at the temperature of 150° C. The converted etching rates of the SiGe film, the $ThO_x$ film, the SiN film, and the Ge film at these temperatures were substantially zero. Thus, it was found that, at a temperature of 50° C. or lower, the Si film can be etched with a substantially infinite selectivity over the SiGe film, the $ThO_x$ film, the SiN film and the Ge film.

OTHER APPLICATIONS

While the embodiments have been described, the presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the structure of the substrate shown in FIG. 2 is merely an example, and the present disclosure can be applied to any substrate having Si and another material at a portion to be in contact with a processing gas. Further, the configurations of the processing system and the etching apparatus are merely examples, and other systems and apparatuses of various configurations can be used. For example, in the above-described embodiments, a non-plasma etching apparatus has been described as an example of the etching apparatus. However, the processing gas may be converted into plasma by an appropriate method. Further, although the case where the semiconductor wafer is used as the substrate has been described, the substrate is not limited thereto and may be another substrate such as a flat panel display (FPD) substrate represented by a liquid crystal display (LCD) substrate, a ceramic substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An etching method comprising:
   providing a substrate having a region consisting only of Si and another material; and
   selectively etching the region consisting only of Si over said another material by supplying a germanium-containing gas as an etching gas to the substrate,
   wherein the region consisting only of Si is selectively etched by supplying a compound gas of germanium only or by supplying the compound gas of germanium and an inert gas only,
   wherein the region consisting only of Si is a Si film,
   said another material is a SiGe film or a Ge film, and
   the substrate has a laminated structure in which the Si film and the SiGe film are laminated alternately or the Si film and the Ge film are laminated alternately.

2. The etching method of claim 1, wherein the SiGe film, the Ge film, and the Si film are formed by an epitaxial method.

3. The etching method of claim 1, wherein, in said etching, a pressure is within a range of 1.33 Pa to 39990 Pa.

4. The etching method of claim 1, further comprising, before said etching:
   removing a natural oxide film on a surface of the substrate.

5. The etching method of claim 1, further comprising:
   removing residues remaining after said etching.

6. The etching method of claim 1, wherein said etching is non-plasma etching in which the etching gas is supplied to the substrate without being converted into plasma.

7. The etching method of claim 1, wherein the compound gas of germanium is a compound gas of germanium and hydrogen or a compound gas of germanium and halogen.

8. The etching method of claim 7, wherein the compound gas of germanium and hydrogen or the compound gas of germanium and halogen is at least one of $GeF_4$ gas, $GeF_2Cl_2$ gas, $GeCl_4$ gas, and $GeH_4$ gas.

9. The etching method of claim 1, wherein, in said etching, a temperature of the substrate is higher than or equal to −20° C. and lower than or equal to 300° C.

10. The etching method of claim 9, wherein, in said etching, the temperature of the substrate is lower than or equal to 150° C.

11. An etching apparatus comprising:
   a chamber configured to accommodate a substrate having a region consisting only of Si and another material;
   a substrate support on which the substrate is supported in the chamber,
   a gas supply unit configured to supply a germanium-containing gas as an etching gas into the chamber;
   a gas exhaust unit configured to exhaust the chamber;
   a temperature control unit configured to adjust a temperature of the substrate on the substrate support; and
   a control unit configured to control the gas supply unit, the gas exhaust unit, and the temperature control unit such that the region consisting only of Si is selectively etched over said another material,
   wherein the region consisting only of Si is selectively etched by supplying a compound gas of germanium only or by supplying the compound gas of germanium and an inert gas only,
   wherein the region consisting only of Si is a Si film,
   said another material is a SiGe film or a Ge film, and the substrate has a laminated structure in which the Si film and the SiGe film are laminated alternately or the Si film and the Ge film are laminated alternately.

12. The etching apparatus of claim 11, wherein the compound gas of germanium is a compound gas of germanium and hydrogen or a compound gas of germanium and halogen.

13. The etching apparatus of claim 12, wherein the compound gas of germanium and hydrogen or the compound gas of germanium and halogen is at least one of $GeF_4$ gas, $GeF_2Cl_2$ gas, $GeCl_4$ gas, and $GeH_4$ gas.

* * * * *